(12) United States Patent
Chavali et al.

(10) Patent No.: US 11,764,150 B2
(45) Date of Patent: Sep. 19, 2023

(54) INDUCTORS FOR PACKAGE SUBSTRATES

(71) Applicant: Intel Corporation, Santa Clara, CA (US)

(72) Inventors: Sri Chaitra Jyotsna Chavali, Chandler, AZ (US); Tarek Ibrahim, Mesa, AZ (US); Wei-Lun Jen, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 929 days.

(21) Appl. No.: 16/502,025

(22) Filed: Jul. 3, 2019

(65) Prior Publication Data

US 2021/0005550 A1 Jan. 7, 2021

(51) Int. Cl.
| | |
|---|---|
| *H01L 23/522* | (2006.01) |
| *H01L 21/768* | (2006.01) |
| *H01L 49/02* | (2006.01) |
| *H05K 1/18* | (2006.01) |
| *H01L 23/48* | (2006.01) |
| *H01L 23/64* | (2006.01) |

(52) U.S. Cl.
CPC .... *H01L 23/5227* (2013.01); *H01L 21/76877* (2013.01); *H01L 23/481* (2013.01); *H01L 23/645* (2013.01); *H01L 28/10* (2013.01); *H05K 1/181* (2013.01); *H05K 2201/1003* (2013.01)

(58) Field of Classification Search
CPC . H01L 23/645; H01L 23/5227; H01L 23/481; H01L 28/10; H01L 21/76877; H05K 1/181
See application file for complete search history.

(56) References Cited

U.S. PATENT DOCUMENTS

| | | | |
|---|---|---|---|
| 2004/0238929 A1* | 12/2004 | Anzai | H01L 23/5227 |
| | | | 257/678 |
| 2012/0186073 A1* | 7/2012 | Feller | H01Q 1/38 |
| | | | 29/600 |
| 2018/0204811 A1* | 7/2018 | Saito | H01L 28/10 |

* cited by examiner

*Primary Examiner* — Feifei Yeung Lopez
(74) *Attorney, Agent, or Firm* — Schwabe, Williamson & Wyatt, P.C.

(57) ABSTRACT

Embodiments herein describe techniques for a semiconductor device including a package substrate having a core layer. An inductor may include a first coaxial line and a second coaxial line vertically through the core layer, and an interconnect within the package substrate coupling the first coaxial line and the second coaxial line. A first magnetic segment may surround the first coaxial line within the core layer, and a second magnetic segment may surround the second coaxial line within the core layer. In addition, a third magnetic segment may surround the interconnect and be coupled to the first magnetic segment and the second magnetic segment. Other embodiments may be described and/or claimed.

18 Claims, 10 Drawing Sheets

INDUCTORS FOR PACKAGE SUBSTRATES

FIELD

Embodiments of the present disclosure generally relate to the field of integrated circuits, and more particularly, to inductors for package substrates.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

Integrated circuit (IC) packages are used in consumer electronics and mobile communications devices that play an essential role in current everyday life. Various packing technologies, e.g., stacked IC packages, complex system-in-packages (SiPs), flip chip interconnection and through-silicon vias, and package substrates, have been developed. Inductors may be used in many IC packages for various applications, e.g., power delivery. However, current inductor designs may still have some performance drawbacks. Improvements are desired for better inductor designs.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1A:
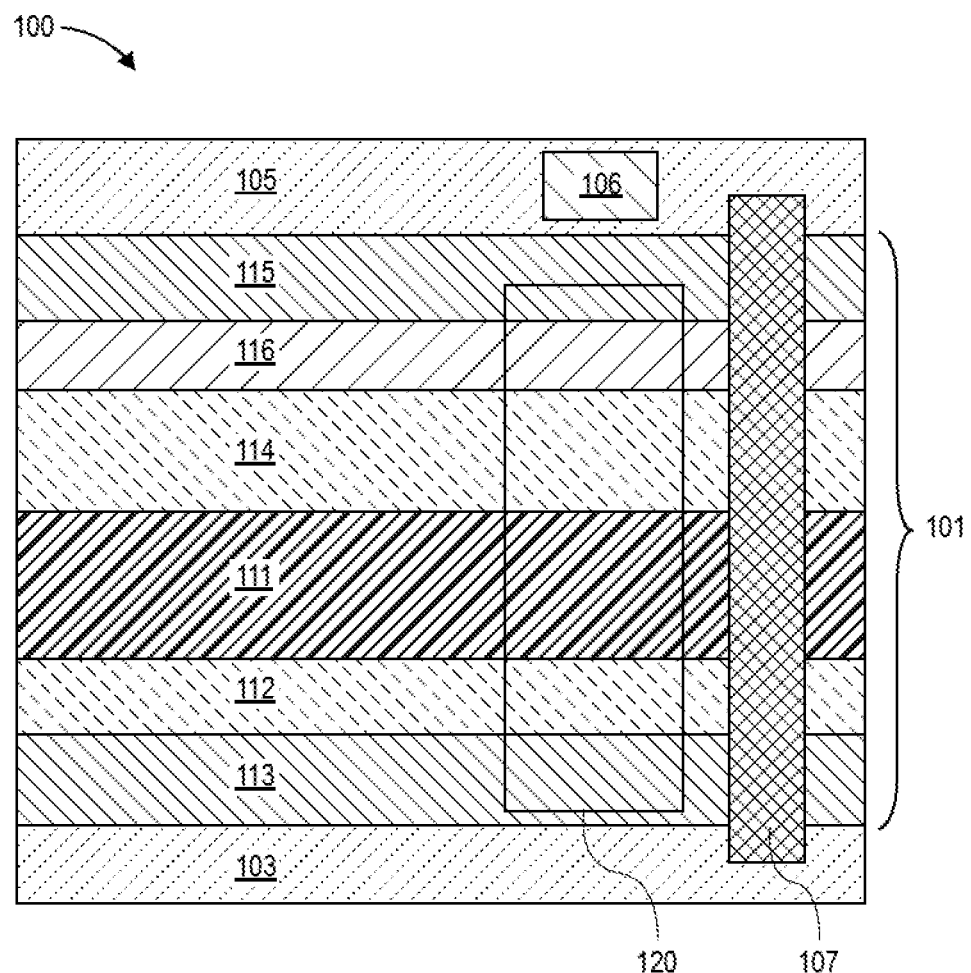
FIGS. 1(a)-1(c) schematically illustrate an example package substrate including an inductor with coaxial lines coupled by an interconnect that is surrounded by a magnetic segment, in accordance with various embodiments.

An integrated circuit (IC) package may include a semiconductor die placed on a package substrate, which may be further placed on a printed circuit board (PCB). Inductors may be used in many IC packages for various applications, e.g., power delivery. For example, an inductor embedded in a package substrate may store energy within the inductor when current passes through the coils of the inductor. Typically, an inductor within a package substrate may be designed as a race track inductor through one or more layers, e.g., a core layer, of the package substrate. In some designs, a part of a race track inductor within through holes of a core layer may be embedded inside a magnetic material to increase the inductance. However, the traces or interconnects running between the through holes of the core layer of the package substrate may not be embedded in magnetic materials.

Embodiments herein may present improved designs for inductors with better performances, e.g., higher overall inductances, without taking any more area as compared to a currently available generic inductor design. To the contrary, for a same amount of inductance, the area occupied by embodiments herein may be reduced. The inductance of an inductor presented in embodiments herein may be improved to about square of number of turns ($\alpha\ N^2$) as opposed to having a linear relationship with number of turns ($\alpha\ N$). Therefore, embodiments herein may have an advantage for scalability as the size of the core layer of the package substrate decreases with time. In some details, an inductor presented in embodiments herein may include a first coaxial line and a second coaxial line vertically through a core layer of a package substrate, and an interconnect within the package substrate coupling the first coaxial line and the second coaxial line. A magnetic segment may surround the interconnect so that the overall inductance of the inductor can be improved.

Embodiments herein may present a semiconductor device including a package substrate having a core layer. An inductor may include a first coaxial line and a second coaxial line vertically through the core layer, and an interconnect within the package substrate coupling the first coaxial line and the second coaxial line, where the interconnect is above or below the core layer. A first magnetic segment may surround the first coaxial line within the core layer, and a second magnetic segment may surround the second coaxial line within the core layer. In addition, a third magnetic segment may surround the interconnect and be coupled to the first magnetic segment and the second magnetic segment. The first magnetic segment, the second magnetic segment, or the third magnetic segment may include a magnetic material.

In embodiments, a method for forming a semiconductor device is presented. The method includes forming one or two through holes vertically through at least a core layer of a package substrate, and filling the one or two through holes of the core layer with a magnetic material. The method may further include forming a first hole and a second hole through the magnetic material filling the one or two through holes of the core layer. In addition, the method may include forming a first coaxial line within the first hole through the magnetic material, and a second coaxial line within the second hole through the magnetic material, and an interconnect coupling the first coaxial line and the second coaxial line, wherein the interconnect is above or below the core layer. Furthermore, the method includes forming a magnetic segment above the core layer, above the interconnect, and covering the interconnect.

Embodiments herein may present a computing device, which may include a print circuit board (PCB), a semiconductor die, and a package substrate between the semiconductor die and the PCB. The package substrate includes a core layer. An inductor may include a first coaxial line and a second coaxial line vertically through the core layer, and an interconnect within the package substrate coupling the first coaxial line and the second coaxial line, where the interconnect is above or below the core layer. A first magnetic segment may surround the first coaxial line within the core layer, and a second magnetic segment may surround the second coaxial line within the core layer. In addition, a third magnetic segment may surround the interconnect and be coupled to the first magnetic segment and the second magnetic segment. The first magnetic segment, the second magnetic segment, or the third magnetic segment may include a magnetic material.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, zinc oxide or other combinations of group III-V, II-VI, group IV, or semiconducting oxide materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 1B:
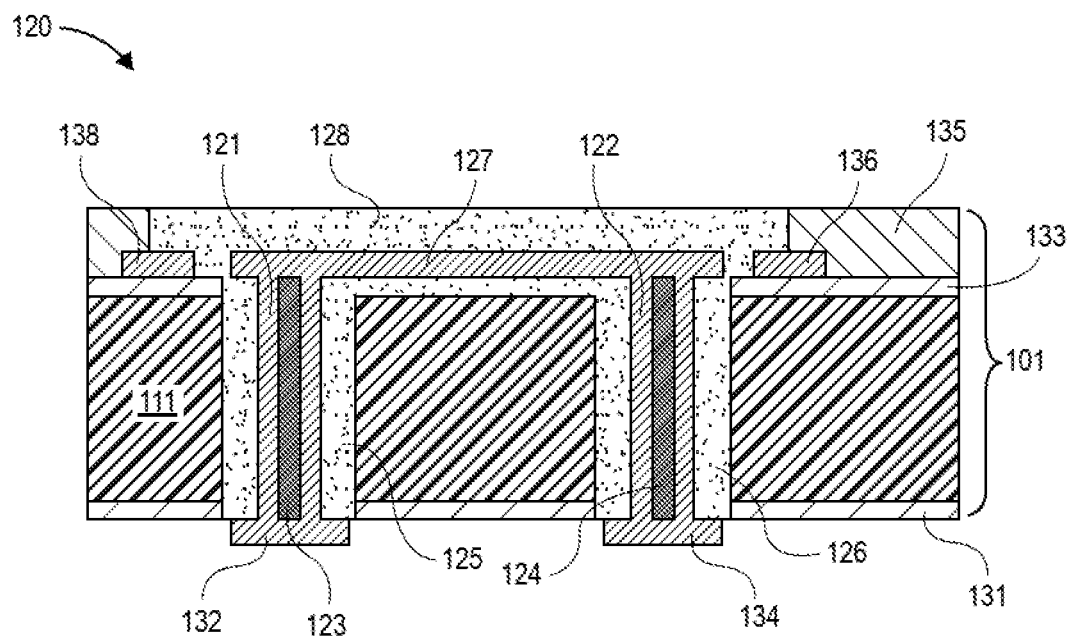
Figure 1C:
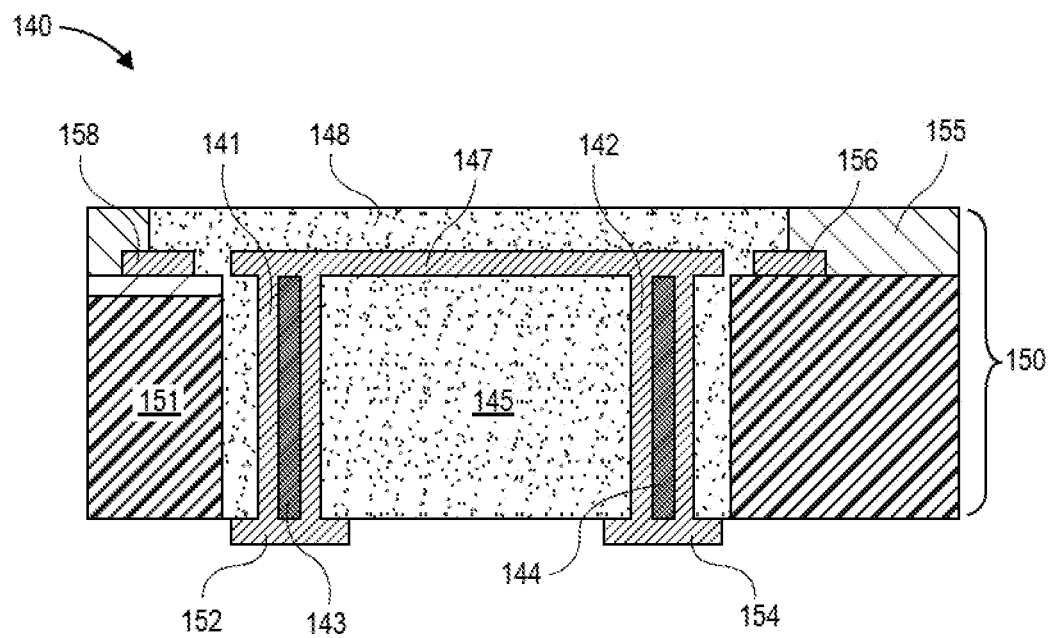

FIGS. 1(a)-1(c) schematically illustrate an example package substrate including an inductor with coaxial lines coupled by an interconnect surrounded by a magnetic segment, in accordance with various embodiments. FIG. 1(a) shows a semiconductor die 105 placed on a package substrate 101, which may be further placed on a PCB 103, where the package substrate 101 includes an inductor 120. FIGS. 1(b)-1(c) illustrate more details of an inductor 120 or an inductor 140 with coaxial lines coupled by an interconnect surrounded by a magnetic segment.

In embodiments, as shown in FIG. 1(a), a semiconductor device 100 includes the semiconductor die 105. The semiconductor die 105 may include various active devices or passive devices, e.g., a transistor 106. Furthermore, the semiconductor device 100 includes the PCB 103, and the package substrate 101. A silicon through via (STV) 107 may be through the package substrate 101 to couple a component of the die 105 with a component of the PCB 103. An inductor 120 may be embedded within the package substrate 101. There may be various layers in the package substrate 101. For example, there may be a core layer 111, a dielectric layer 112 below the core layer 111, a dielectric layer 114 or a dielectric layer 116 above the core layer 111, a solder resist layer 113 and a solder resist layer 115 below and above the core layer 111 respectively. There may be other layers, e.g., conductive layers, within the package substrate 101, not shown.

In embodiments, the semiconductor device 100 may be a part of wearable device or a mobile computing device. In addition, not shown, the wearable device or the mobile computing device may include one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

In embodiments, as shown in FIG. 1(b), the inductor 120 is embedded within the package substrate 101. The package substrate 101 includes the core layer 111, a dielectric layer 135 above the core layer 111, an insulated polymer layer 133 between the dielectric layer 135 and the core layer 111, and an insulated polymer layer 131 below the core layer 111.

In embodiments, the inductor 120 includes a first coaxial line 121 and a second coaxial line 122 vertically through the core layer 111, the insulated polymer layer 133, and the insulated polymer layer 131. An interconnect 127 is within dielectric layer 135, above the core layer 111, coupling the first coaxial line 121 and the second coaxial line 122. The first coaxial line 121 includes a cavity filled by a plug material 123, and the second coaxial line 122 includes a cavity filled by a plug material 124. A contact electrode 132 is coupled to the first coaxial line 121, and a contact electrode 134 is coupled to the second coaxial line 122.

A first magnetic segment 125 surrounds the first coaxial line 121 within the core layer 111, and a second magnetic segment 126 surrounds the second coaxial line 122 within the core layer 111. A third magnetic segment 128 is within the dielectric layer 135, surrounds the interconnect 127, and coupled to the first magnetic segment 125 and the second magnetic segment 126. The first magnetic segment 125, the second magnetic segment 126, or the third magnetic segment 128 includes a magnetic material. The first magnetic segment 125 and the second magnetic segment 126 are through the core layer 111 and may help to improve the inductance of the inductor 120. However, without the third magnetic segment 128, the interconnect 127 is not covered by magnetic material. Embodiments herein includes the third magnetic segment 128, which can further increase the inductance of the inductor 120. The introduction of the third magnetic segment 128 may need different processes to make the inductor 120, which may be shown in FIG. 2, FIGS. 3(a)-3(j), and FIGS. 4(a)-4(h). In addition, a conductive stop 138 and a conductive stop 136 are partially embedded in the third magnetic segment 128, and separated from the interconnect 127.

In embodiments, the core layer 111 may include organic resin, inorganic filler, or a conductive material. Additionally and alternatively, the core layer 111 may include an epoxy with fillers such as silica and with glass fiber weave made out of silica. The core layer 111 may further include many material layers in itself. For example, the core layer 111 may be a combination of the various dielectric materials including buildup material that is also made out of epoxy with silica or magnesia fillers. Similarly, the package substrate 101 may include the core layer 111 and multiple other layers, and the first coaxial line 121 and the second coaxial line 122 are vertically through some of the multiple other layers. In embodiments, the package substrate 101 includes a material selected from a glass material, a resin material, or a filler material.

In embodiments, the magnetic material included in the first magnetic segment 125, the second magnetic segment 126, or the third magnetic segment 128 may include a diamagnetism material, a paramagnetism material, a ferromagnetism material, a ferrimagnetism material, or an antiferromagnetism material. The dielectric layer 135 may include a resin material selected from FR-4-epoxy, polyfunctional FR-4, high temperature one component epoxy system, bismaleimide trizaine epoxy (BT), polyimide epoxy, cyanate ester (CE), polyimide, or polyimide and polytetrafluoroethylene (PTFE).

In embodiments, the first coaxial line 121 or the second coaxial line 122 includes a cavity surrounded by a conductive layer, and the conductive layer includes a material selected from the group consisting of titanium (Ti), molybdenum (Mo), gold (Au), platinum (Pt), aluminum (Al), nickel (Ni), copper (Cu), chromium (Cr), hafnium (Hf), indium (In), and an alloy of Ti, Mo, Au, Pt, Al, Ni, Cu, Cr, TiAlN, HfAlN, or InAlO. The plug material included in the cavity of the first coaxial line 121 or in the cavity of the second coaxial line 122 may include a polymer material, or an epoxy polymeric material with silica particles or filler particles. The interconnect 127 may include a material selected from the group consisting of titanium (Ti), molybdenum (Mo), gold (Au), platinum (Pt), aluminum (Al), nickel (Ni), copper (Cu), chromium (Cr), hafnium (Hf), indium (In), and an alloy of Ti, Mo, Au, Pt, Al, Ni, Cu, Cr, TiAlN, HfAlN, or InAlO.

The inductor 120 shown in FIG. 1(b) may be one example. There may be many other different designs for such an inductor embedded within a package substrate. In embodiments, as shown in FIG. 1(c), the inductor 140 is embedded within the package substrate 150. The package substrate 150 includes the core layer 151 and a dielectric layer 155 above the core layer 151. The inductor 140 includes a first coaxial line 141 and a second coaxial line 142 vertically through the core layer 151. An interconnect 147 is within dielectric layer 155, above the core layer 151, coupling the first coaxial line 141 and the second coaxial line 142. The first coaxial line 141 includes a cavity filled by a plug material 143, and the second coaxial line 142 includes a cavity filled by a plug material 144. A magnetic segment 145 surrounds the first coaxial line 141 and the second coaxial line 142 within the core layer 151. The magnetic segment 145 may be viewed as a first magnetic segment surrounding the first coaxial line 141 and the second magnetic segment surrounding the second coaxial line 142 coupled together within the core layer 151 by the magnetic material. A third magnetic segment 148 is within the dielectric layer 155, surrounds the interconnect 147, and coupled to the first magnetic segment 145. The magnetic segment 145 or the third magnetic segment 148 may include a magnetic material. A conductive stop 158 and a conductive stop 156 are partially embedded in the third magnetic segment 148, and separated from the interconnect 147. A contact electrode 152 is coupled to the first coaxial line 141, and a contact electrode 154 is coupled to the second coaxial line 142.

Figure 2:
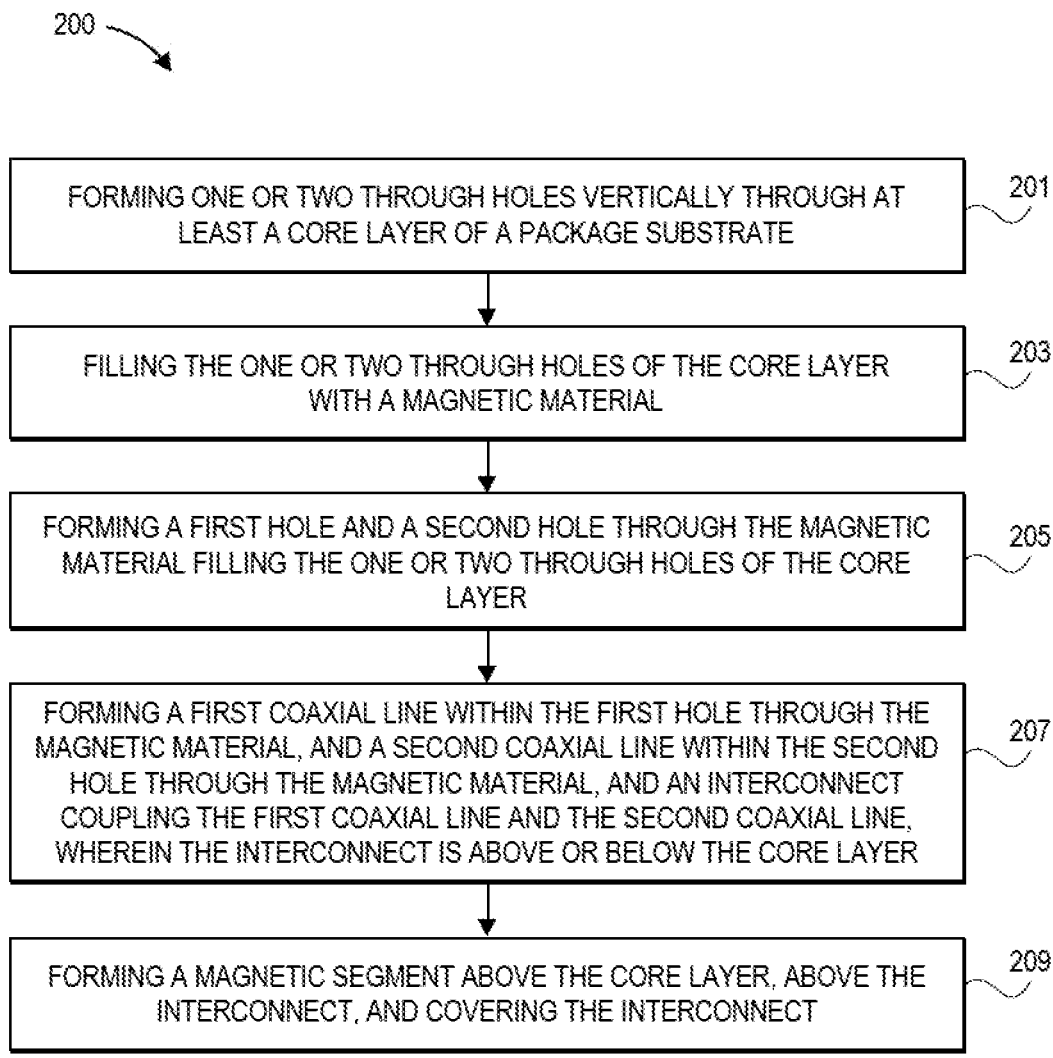
FIG. 2 illustrates a diagram of a process for forming a package substrate including an inductor with coaxial lines coupled by an interconnect that is surrounded by a magnetic segment, in accordance with various embodiments.

FIG. 2 illustrates a diagram of a process 200 for forming a package substrate including an inductor with coaxial lines coupled by an interconnect that is surrounded by a magnetic segment, in accordance with various embodiments. In embodiments, the process 200 may be applied to form an inductor similar to the inductor 120 or the inductor 140 as shown in FIGS. 1(b)-1(c). FIGS. 3(a)-3(j) and FIGS. 4(a)-4(h) illustrate the process 200 in more details.

Figure 3A:
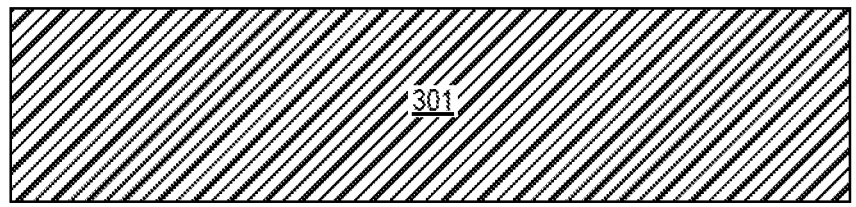
FIGS. 3(a)-3(j) illustrate a process for forming a package substrate including an inductor with coaxial lines coupled by an interconnect that is surrounded by a magnetic segment, in accordance with various embodiments.
Figure 3B:
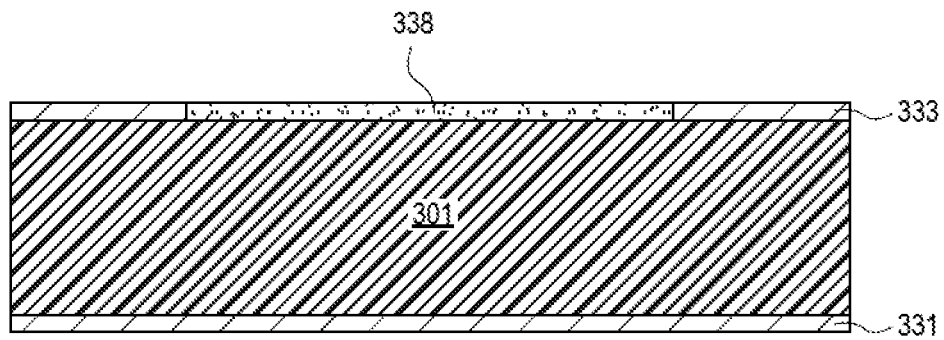
Figure 3C:
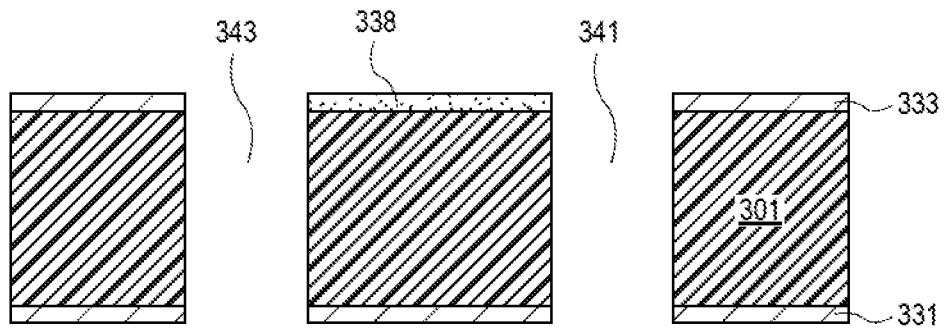
Figure 3D:
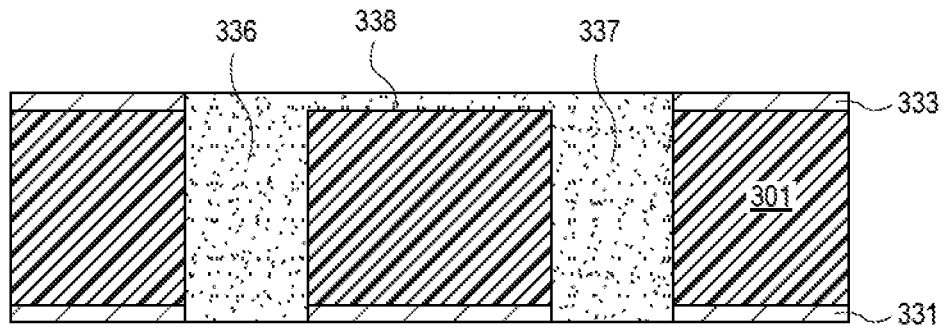
Figure 3E:
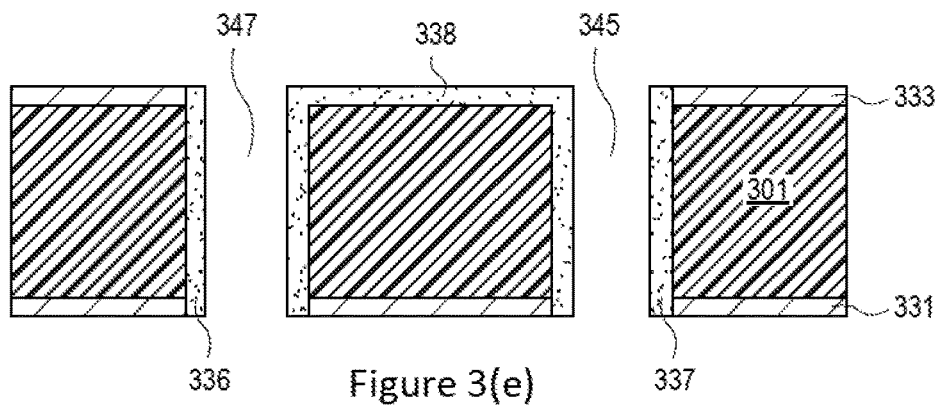
Figure 3F:
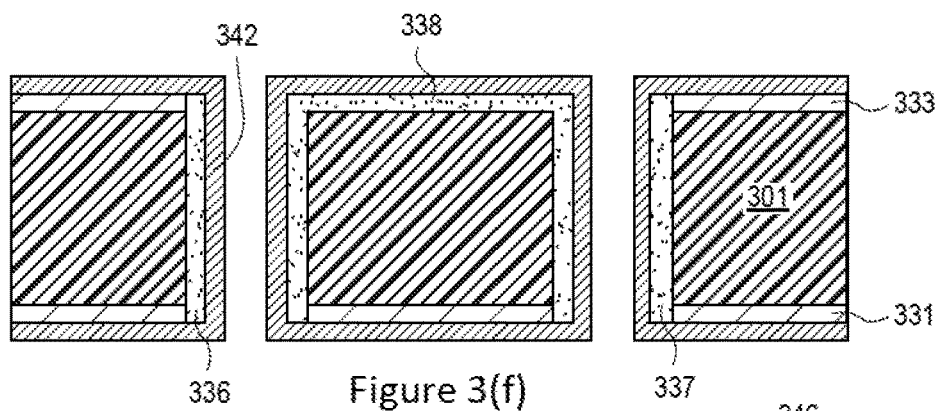
Figure 3G:
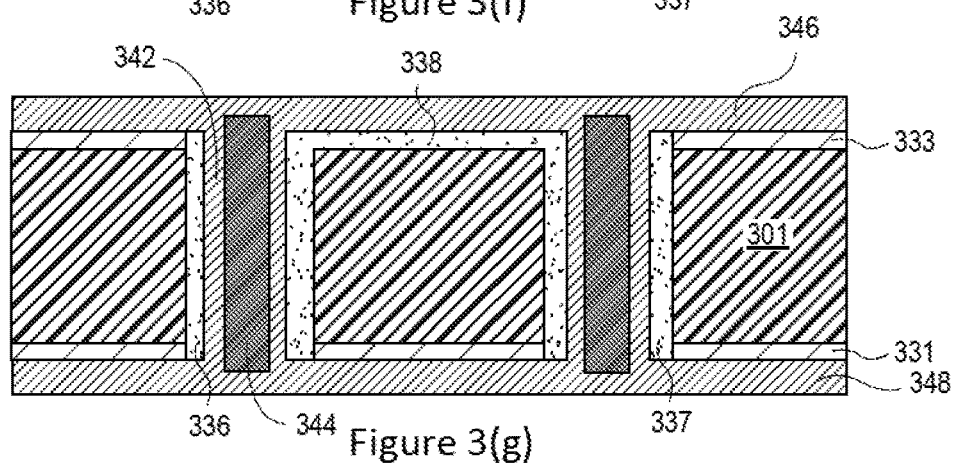
Figure 3H:
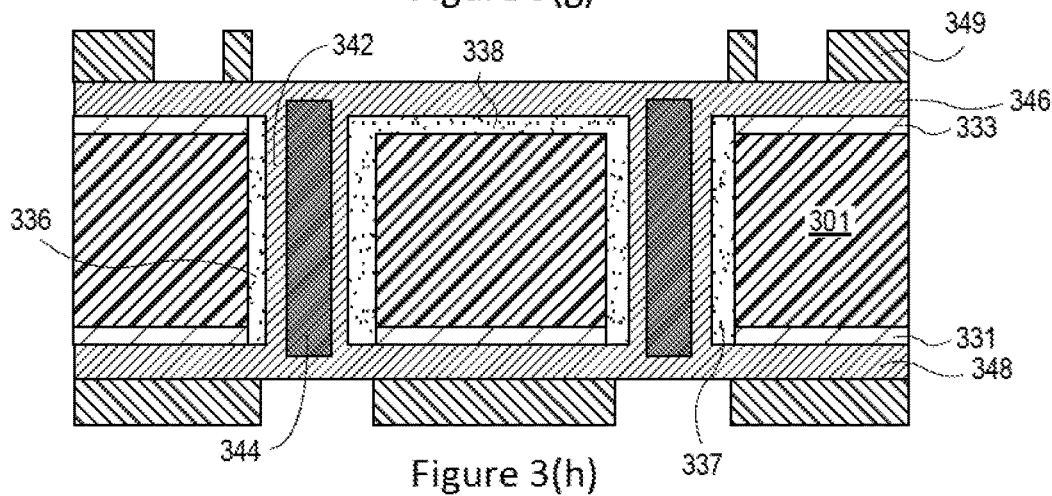
Figure 3I:
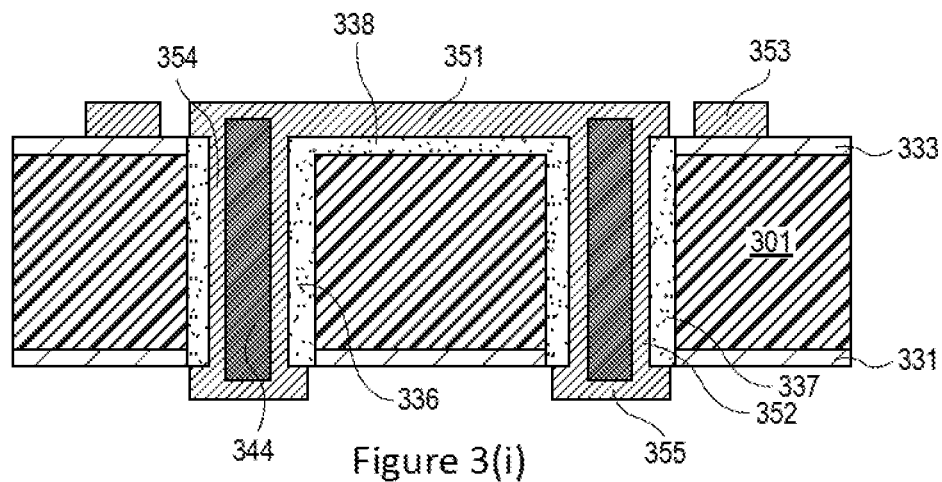
Figure 3J:
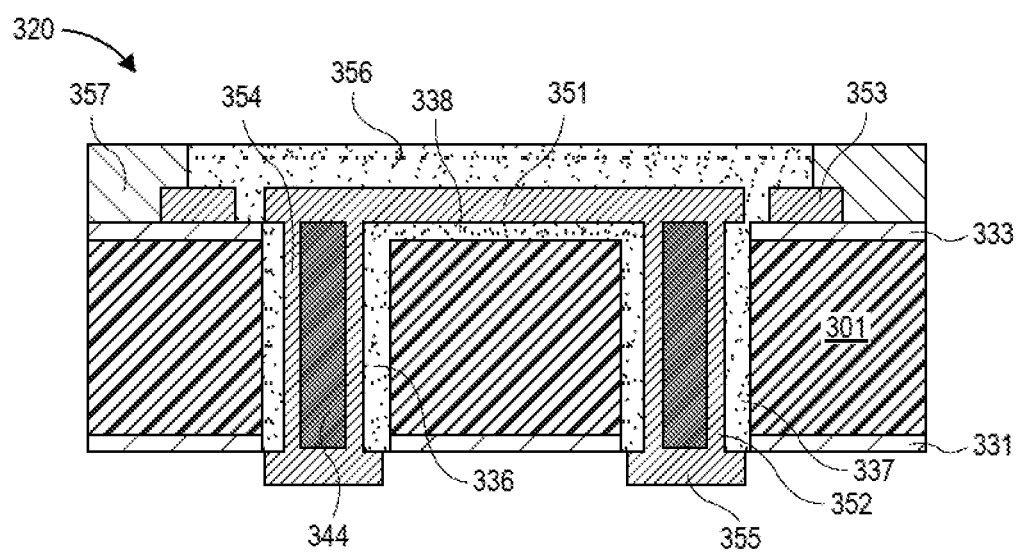
Figure 4A:
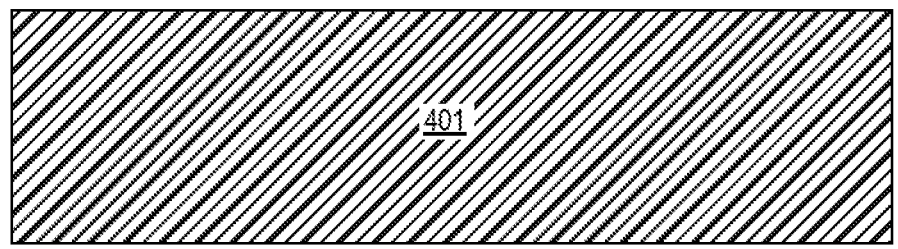
FIGS. 4(a)-4(h) illustrate a process for forming a package substrate including an inductor with coaxial lines coupled by an interconnect that is surrounded by a magnetic segment, in accordance with various embodiments.
Figure 4B:
Figure 4C:
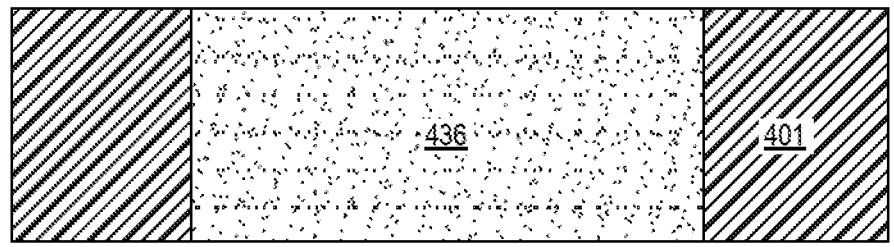
Figure 4D:
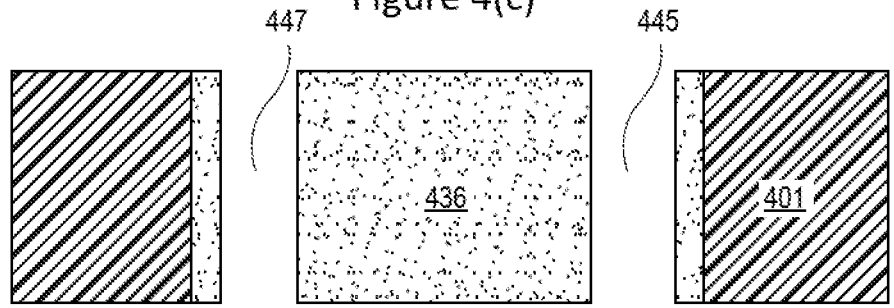
Figure 4E:
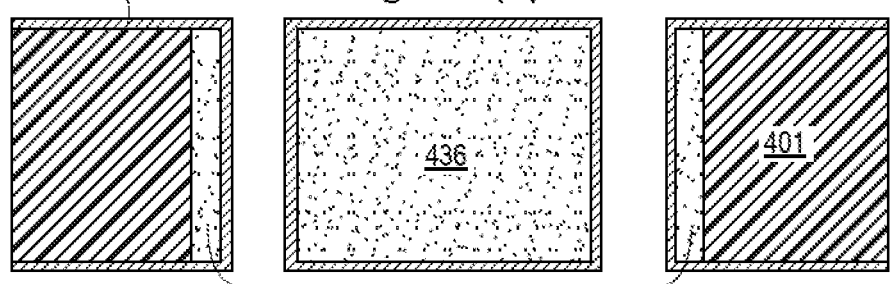
Figure 4F:
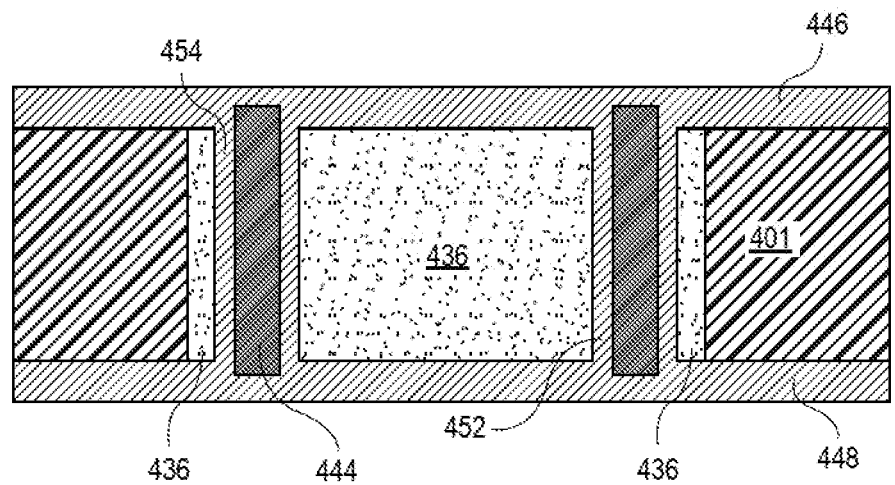
Figure 4G:
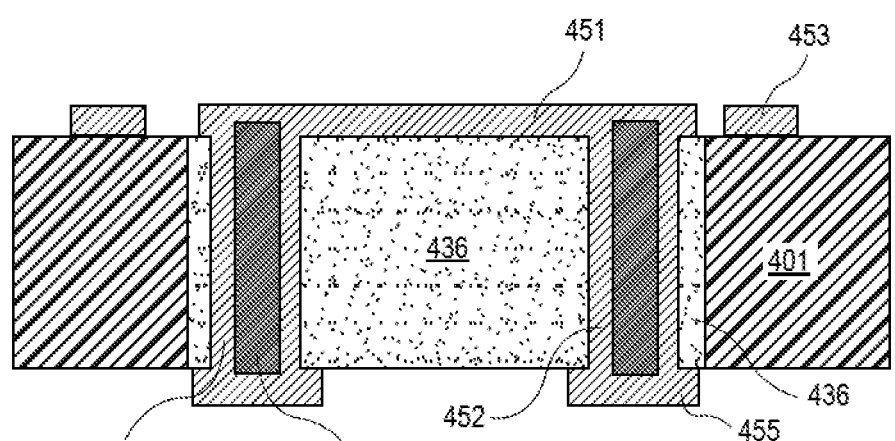
Figure 4H:
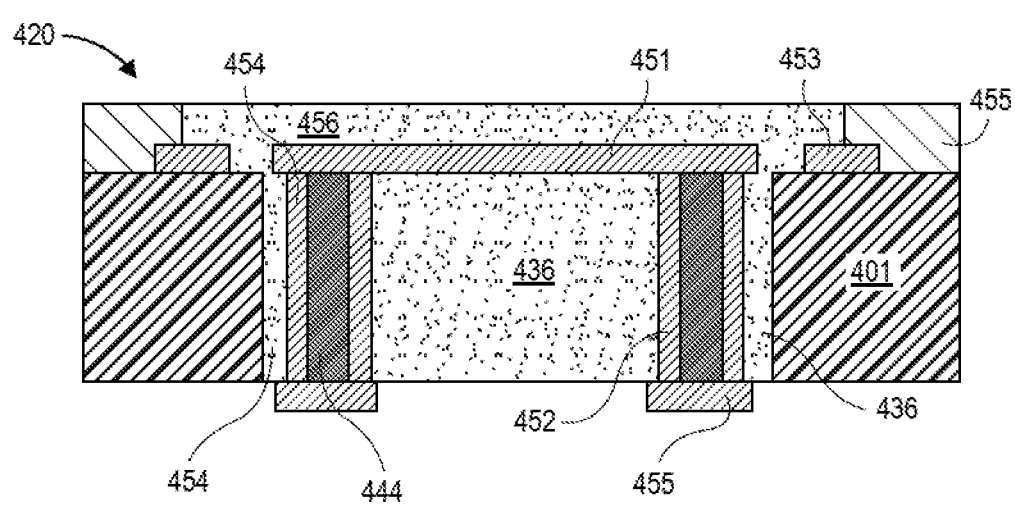

At block 201, the process 200 may include forming one or two through holes vertically through at least a core layer of a package substrate. For example, as shown in FIG. 3(a), a package substrate includes a core layer 301. As shown in FIG. 3(b), an insulated polymer layer 331 and an insulated polymer layer 333 may be formed above and below the core layer 301, respectively. In addition, a magnetic segment 338 may be formed at a portion of the insulated polymer layer 333 above the core layer 301. As shown in FIG. 3(c), two through holes, e.g., a through hole 341 and a through hole 343, are formed through the core layer 301, the insulated polymer layer 331, and the insulated polymer layer 333. Additionally and alternatively, as shown in FIG. 4(a), a package substrate includes a core layer 401. As shown in FIG. 4(b), a through hole 441 is formed through the core layer 401.

At block 203, the process 200 may include filling the one or two through holes of the core layer with a magnetic material. For example, in detail, as shown in FIG. 3(*d*), the process 200 may include filling the through hole 341 and the through hole 343 with a magnetic material to form a magnetic area 336 and a magnetic area 337, respectively. The magnetic area 336 and the magnetic area 337 are coupled to the magnetic segment 338 to form a continuous magnetic area. Additionally and alternatively, as shown in FIG. 4(*c*), the process 200 may include filling the through hole 441 with a magnetic material to form a magnetic area 436.

At block 205, the process 200 may include forming a first hole and a second hole through the magnetic material filling the one or two through holes of the core layer. For example, as shown in FIG. 3(*e*), the process 200 may include forming a first hole 345 and a second hole 347 through the magnetic material filling the two through holes, e.g., the through hole 341 and the through hole 343, of the core layer 301. Additionally and alternatively, as shown in FIG. 4(*d*), the process 200 may include forming a first hole 445 and a second hole 447 through the magnetic material 436 filling the through hole 441 of the core layer 401.

At block 207, the process 200 may include forming a first coaxial line within the first hole through the magnetic material, and a second coaxial line within the second hole through the magnetic material, and an interconnect coupling the first coaxial line and the second coaxial line, wherein the interconnect is above or below the core layer. In various embodiments, the first coaxial line, the second coaxial line, and the interconnect may be formed by multiple steps, e.g., steps shown in FIGS. 3(*f*)-3(*i*), or steps shown in FIGS. 4(*e*)-4(*g*). For example, as shown in FIG. 3(*f*), the process 200 may include forming a conductive layer 342 around the first hole 345 and the second hole 347, above and below the insulated polymer layer 331 and the insulated polymer layer 333. Afterwards, as shown in FIG. 3(*g*), a conductive layer 348 may be formed at the bottom of the insulated polymer layer 331, and coupled to the conductive layer 342 at the bottom, resulting in a cavity within the first hole 345 and a cavity within the second hole 347. A plug material 344 may be used to fill the cavity within the first hole 345 and the cavity within the second hole 347. Moreover, a conductive layer 346 is formed on top of the insulated polymer layer 333, coupled to the conductive layer 342 at the top so that the cavity within the first hole 345 and the cavity within the second hole 347 are fully enclosed. In addition, as shown in FIG. 3(*h*), a photoresist pattern 349 may be formed on top of the conductive layer 346 or below the conductive layer 348. As shown in FIG. 3(*i*), a contact electrode 355 and an interconnect 351 are formed based on the photoresist pattern 349. As a result, a first coaxial line 352 is formed filling the first hole 345, where the first coaxial line 352 includes the conductive layer 342, the plug material 344 filled through the core layer 301, while covered by the contact electrode 355 and the interconnect 351 at both ends. Similarly, a second coaxial line 354 is formed filling the second hole 347, where the second coaxial line 354 includes the conductive layer 342, the plug material 344 filled through the core layer 301, while covered by the contact electrode 355 and the interconnect 351 at both ends.

Additionally and alternatively, as shown in FIG. 4(*e*), the process 200 may include forming a conductive layer 442 around the first hole 445 and the second hole 447, above and below the core layer 401. Afterwards, as shown in FIG. 4(*f*), a conductive layer 448 may be formed at the bottom of the core layer 401, and coupled to the conductive layer 442 at the bottom, resulting in a cavity within the first hole 445 and a cavity within the second hole 447. A plug material 444 may be used to fill the cavity within the first hole 445 and the cavity within the second hole 447. Moreover, a conductive layer 446 is formed on top of the core layer 401, coupled to the conductive layer 442 at the top so that the cavity within the first hole 445 and the cavity within the second hole 447 are fully enclosed. In addition, as shown in FIG. 4(*g*), a contact electrode 455 and an interconnect 451 are formed above and below the core layer 401. As a result, a first coaxial line 452 is formed filling the first hole 445, where the first coaxial line 452 includes the conductive layer 442, the plug material 444 filled through the core layer 401, while covered by the contact electrode 455 and the interconnect 451 at both ends. Similarly, a second coaxial line 454 is formed filling the second hole 447, where the second coaxial line 454 includes the conductive layer 442, the plug material 444 filled through the core layer 401, while covered by the contact electrode 455 and the interconnect 451 at both ends.

At block 209, the process 200 may include forming a magnetic segment above the core layer, above the interconnect, and covering the interconnect. For example, as shown in FIG. 3(*j*), the process 200 may include forming a magnetic segment 356 above the core layer 301, above the interconnect 351, and covering the interconnect 351. As a result, an inductor 320 may be formed, which may be similar to the inductor 120 shown in FIG. 1(*b*). Additionally and alternatively, as shown in FIG. 4(*h*), the process 200 may include forming a magnetic segment 456 above the core layer 401, above the interconnect 451, and covering the interconnect 451. As a result, an inductor 420 may be formed, which may be similar to the inductor 140 shown in FIG. 1(*c*).

Figure 5:
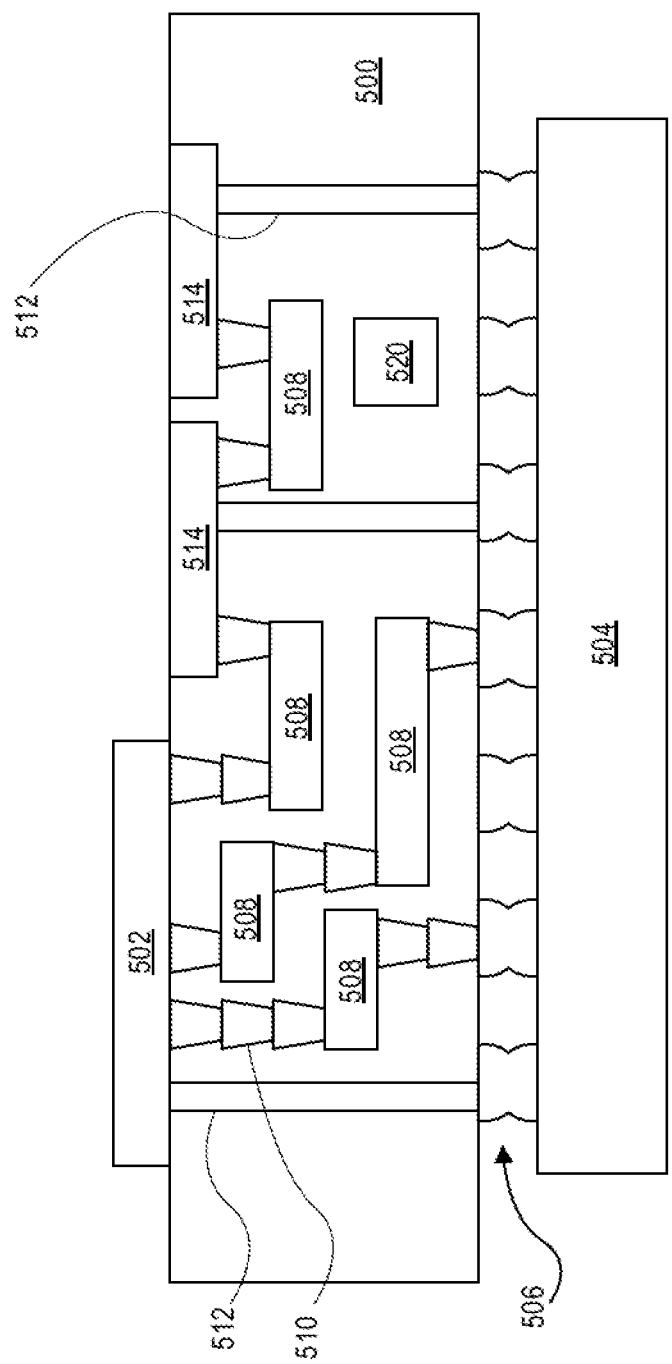
FIG. 5 schematically illustrates a package substrate implementing one or more embodiments of the disclosure, in accordance with various embodiments.

FIG. 5 schematically illustrates a package substrate 500 implementing one or more embodiments of the disclosure, in accordance with some embodiments. The package substrate 500 is an intervening substrate used to bridge a first substrate 502 to a second substrate 504. The first substrate 502 may be, for instance, a substrate support for a die. The second substrate 504 may be, for instance, a memory module, a computer motherboard, or a PCB. For example, a package substrate 500 may couple an integrated circuit die to a ball grid array (BGA) 506 that can subsequently be coupled to the second substrate 504. In some embodiments, the first and second substrates 502/504 are attached to opposing sides of the package substrate 500. In other embodiments, the first and second substrates 502/504 are attached to the same side of the package substrate 500. And in further embodiments, three or more substrates are interconnected by way of the package substrate 500.

The package substrate 500 may be formed of an epoxy resin, a fiberglass-reinforced epoxy resin, a ceramic material, or a polymer material such as polyimide. In further implementations, the package substrate may be formed of alternate rigid or flexible materials that may include the same materials described above for use in a semiconductor substrate, such as silicon, germanium, and other group III-V and group IV materials.

The package substrate may include metal interconnects 508 and vias 510, including but not limited to through-silicon vias (TSVs) 512. The package substrate 500 may further include embedded devices 514, including both passive and active devices, e.g., an inductor 520. The inductor 520 may be similar to the inductor 120 shown in FIGS. 1(*a*)-1(*b*), the inductor 140 shown in FIG. 1(*c*), the inductor 320 shown in FIG. 3(*j*), and the inductor 420 shown in FIG. 4(*h*). Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the package substrate 500.

In accordance with embodiments of the disclosure, apparatuses or processes disclosed herein may be used in the fabrication of package substrate 500.

Figure 6:
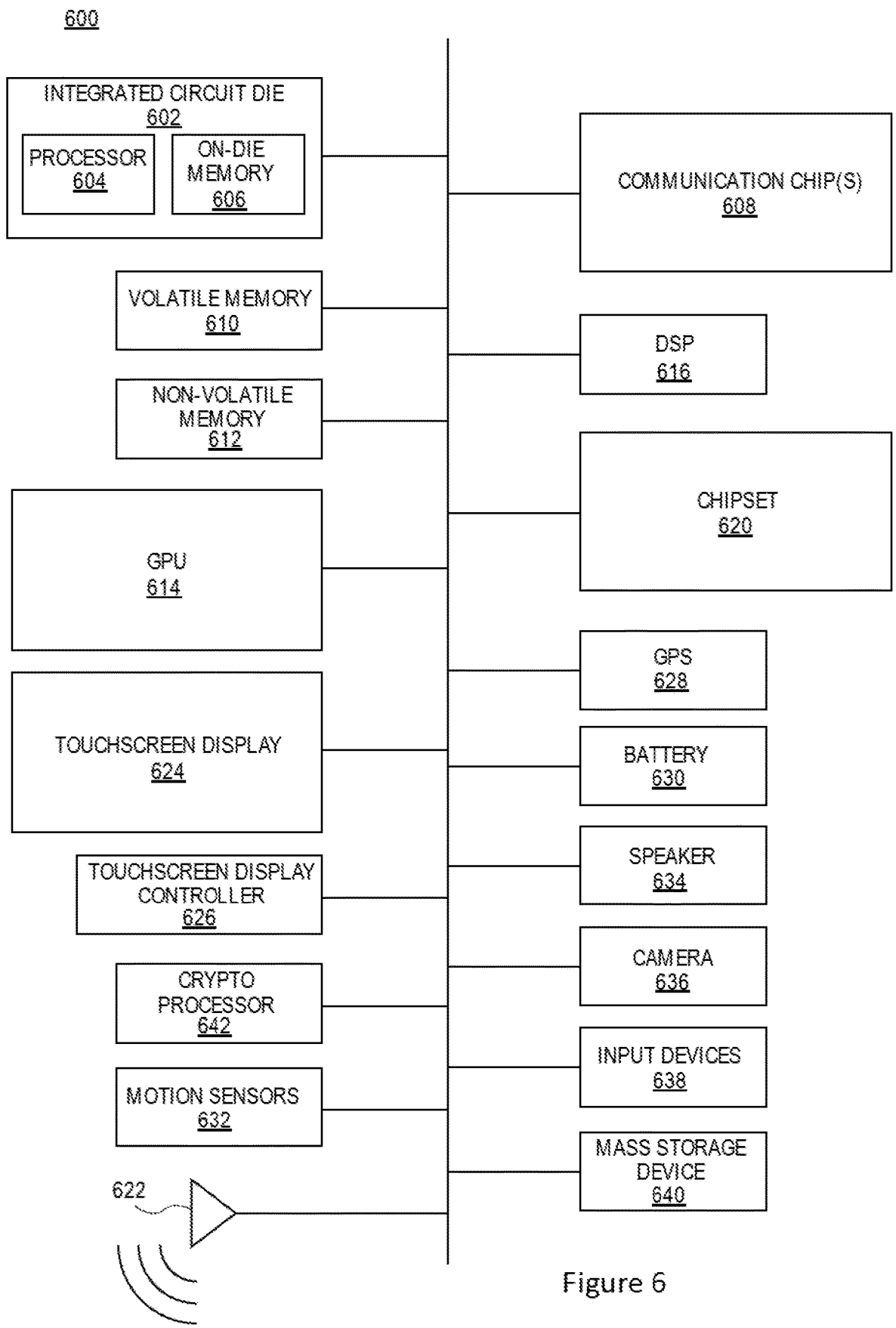
FIG. 6 schematically illustrates a computing device built in accordance with an embodiment of the disclosure, in accordance with various embodiments.

FIG. 6 illustrates a computing device 600 in accordance with one embodiment of the disclosure. The computing device 600 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 600 include, but are not limited to, an integrated circuit die 602 and at least one communications logic unit 608. In some implementations the communications logic unit 608 is fabricated within the integrated circuit die 602 while in other implementations the communications logic unit 608 is fabricated in a separate integrated circuit chip that may be bonded to a substrate or motherboard that is shared with or electronically coupled to the integrated circuit die 602. The integrated circuit die 602 may include a processor 604 as well as on-die memory 606, often used as cache memory, which can be provided by technologies such as embedded DRAM (eDRAM), or SRAM. For example, the on-die memory 606, the processor 604, or the integrated circuit die 602 may be placed on a packaging substrate that includes an inductor, e.g., the inductor 120 shown in FIGS. 1(a)-1(b), the inductor 140 shown in FIG. 1(c), the inductor 320 shown in FIG. 3(j), and the inductor 420 shown in FIG. 4(h). In embodiments, the computing device 600 may include a display or a touchscreen display 624, and a touchscreen display controller 626. A display or the touchscreen display 624 may include a FPD, an AMOLED display, a TFT LCD, a micro light-emitting diode (µLED) display, or others.

Computing device 600 may include other components that may or may not be physically and electrically coupled to the motherboard or fabricated within a SoC die. These other components include, but are not limited to, volatile memory 610 (e.g., dynamic random access memory (DRAM), non-volatile memory 612 (e.g., ROM or flash memory), a graphics processing unit 614 (GPU), a digital signal processor (DSP) 616, a crypto processor 642 (e.g., a specialized processor that executes cryptographic algorithms within hardware), a chipset 620, at least one antenna 622 (in some implementations two or more antenna may be used), a battery 630 or other power source, a power amplifier (not shown), a voltage regulator (not shown), a global positioning system (GPS) device 628, a compass, a motion coprocessor or sensors 632 (that may include an accelerometer, a gyroscope, and a compass), a microphone (not shown), a speaker 634, a camera 636, user input devices 638 (such as a keyboard, mouse, stylus, and touchpad), and a mass storage device 640 (such as hard disk drive, compact disk (CD), digital versatile disk (DVD), and so forth). The computing device 600 may incorporate further transmission, telecommunication, or radio functionality not already described herein. In some implementations, the computing device 600 includes a radio that is used to communicate over a distance by modulating and radiating electromagnetic waves in air or space. In further implementations, the computing device 600 includes a transmitter and a receiver (or a transceiver) that is used to communicate over a distance by modulating and radiating electromagnetic waves in air or space.

The communications logic unit 608 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 608 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 600 may include a plurality of communications logic units 608. For instance, a first communications logic unit 608 may be dedicated to shorter range wireless communications such as Wi-Fi, NFC, and Bluetooth and a second communications logic unit 608 may be dedicated to longer range wireless communications such as GPS, EDGE, GPRS, CDMA, WiMAX, LTE, Ev-DO, and others.

The processor 604 of the computing device 600 includes one or more devices, such as transistors. The term "processor" may refer to any device or portion of a device that processes electronic data from registers and/or memory to transform that electronic data into other electronic data that may be stored in registers and/or memory. The communications logic unit 608 may also include one or more devices, such as transistors.

In further embodiments, another component housed within the computing device 600 may contain one or more devices, such as DRAM, that are formed in accordance with implementations of the current disclosure. In various embodiments, the computing device 600 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Some Non-Limiting Examples are Provided Below.

Example 1 may include a semiconductor device, comprising: a core layer of a package substrate; an inductor including a first coaxial line and a second coaxial line vertically through the core layer, and an interconnect within the package substrate coupling the first coaxial line and the second coaxial line, wherein the interconnect is above or below the core layer; a first magnetic segment surrounding the first coaxial line within the core layer; a second magnetic segment surrounding the second coaxial line within the core layer; and a third magnetic segment surrounding the interconnect and coupled to the first magnetic segment and the second magnetic segment, wherein the first magnetic segment, the second magnetic segment, or the third magnetic segment includes a magnetic material.

Example 2 may include the semiconductor device of example 1, wherein the package substrate includes a dielectric layer above or below the core layer, and the third magnetic segment and the interconnect are within the dielectric layer.

Example 3 may include the semiconductor device of examples 1-2, wherein the dielectric layer includes a resin material selected from FR-4-epoxy, polyfunctional FR-4, high temperature one component epoxy system, bismaleimide trizaine epoxy (BT), polyimide epoxy, cyanate ester (CE), polyimide, or polyimide and polytetrafluoroethylene (PTFE).

Example 4 may include the semiconductor device of examples 1-2, wherein the package substrate includes an insulated polymer layer between the dielectric layer and the core layer, and the first coaxial line and the second coaxial line are vertically through the core layer, the polymer layer, and the dielectric layer.

Example 5 may include the semiconductor device of examples 1-4, wherein the first magnetic segment and the second magnetic segment are coupled together within the core layer by the magnetic material.

Example 6 may include the semiconductor device of examples 1-4, further comprising: a conductive stop partially embedded in the third magnetic segment, and separated from the interconnect.

Example 7 may include the semiconductor device of examples 1-4, wherein the magnetic material included in the first magnetic segment, the second magnetic segment, or the third magnetic segment includes a diamagnetism material, a paramagnetism material, a ferromagnetism material, a ferrimagnetism material, or an antiferromagnetism material.

Example 8 may include the semiconductor device of examples 1-4, wherein the first coaxial line or the second coaxial line includes a cavity surrounded by a conductive layer, and the conductive layer includes a material selected from the group consisting of titanium (Ti), molybdenum (Mo), gold (Au), platinum (Pt), aluminum (Al), nickel (Ni), copper (Cu), chromium (Cr), hafnium (Hf), indium (In), and an alloy of Ti, Mo, Au, Pt, Al, Ni, Cu, Cr, TiAlN, HfAlN, or InAlO.

Example 9 may include the semiconductor device of example 8, wherein the first coaxial line or the second coaxial line includes a plug material contained within the cavity of the first coaxial line or the second coaxial line.

Example 10 may include the semiconductor device of example 9, wherein the plug material includes a polymer material, or an epoxy polymeric material with silica particles or filler particles.

Example 11 may include the semiconductor device of examples 1-10, wherein the interconnect includes a material selected from the group consisting of titanium (Ti), molybdenum (Mo), gold (Au), platinum (Pt), aluminum (Al), nickel (Ni), copper (Cu), chromium (Cr), hafnium (Hf), indium (In), and an alloy of Ti, Mo, Au, Pt, Al, Ni, Cu, Cr, TiAlN, HfAlN, or InAlO.

Example 12 may include the semiconductor device of examples 1-10, wherein the core layer includes organic resin, inorganic filler, or a conductive material.

Example 13 may include the semiconductor device of examples 1-10, wherein the package substrate includes the core layer and multiple other layers, and the first coaxial line and the second coaxial line are vertically through the multiple other layers.

Example 14 may include the semiconductor device of example 13, wherein the package substrate includes a material selected from a glass material, a resin material, or a filler material.

Example 15 may include a method for forming a semiconductor device, comprising: forming one or two through holes vertically through at least a core layer of a package substrate; filling the one or two through holes of the core layer with a magnetic material; forming a first hole and a second hole through the magnetic material filling the one or two through holes of the core layer; forming a first coaxial line within the first hole through the magnetic material, and a second coaxial line within the second hole through the magnetic material, and an interconnect coupling the first coaxial line and the second coaxial line, wherein the interconnect is above or below the core layer; and forming a magnetic segment above the core layer, above the interconnect, and covering the interconnect.

Example 16 may include the method of example 15, when there are two holes formed through the core layer, the method further comprising: forming a magnetic layer above the core layer to connect the magnetic material filling the two through holes of the core layer, wherein the interconnect is formed above the magnetic layer.

Example 17 may include the method of examples 15-16, further comprising: forming one or more additional conductive stop partially embedded in the magnetic segment, and separated from the interconnect.

Example 18 may include the method of examples 15-17, wherein the package substrate further includes a dielectric layer above or below the core layer, and the magnetic segment and the interconnect are within the dielectric layer.

Example 19 may include the method of examples 15-17, wherein the first coaxial line or the second coaxial line includes a cavity surrounded by a conductive layer, wherein the cavity is filled by a dielectric material including epoxy polymeric material with silica particles or filler particles, and the conductive layer includes a material selected from the group consisting of titanium (Ti), molybdenum (Mo), gold (Au), platinum (Pt), aluminum (Al), nickel (Ni), copper (Cu), chromium (Cr), hafnium (Hf), indium (In), and an alloy of Ti, Mo, Au, Pt, Al, Ni, Cu, Cr, TiAlN, HfAlN, or InAlO.

Example 20 may include the method of examples 15-17, wherein there is only one through hole of the core layer formed and filled by the magnetic material, the first hole and the second hole through the magnetic material are separated by the magnetic material.

Example 21 may include a computing device, comprising: a semiconductor die; a printed circuit board (PCB); and a package substrate between the semiconductor die and the PCB, wherein the package substrate includes: a core layer; an inductor including a first coaxial line and a second coaxial line vertically through the core layer, and an interconnect within the package substrate coupling the first coaxial line and the second coaxial line, wherein the interconnect is above or below the core layer; a first magnetic segment surrounding the first coaxial line within the core layer; a second magnetic segment surrounding the second coaxial line within the core layer; and a third magnetic segment surrounding the interconnect and coupled to the first magnetic segment and the second magnetic segment, wherein the first magnetic segment, the second magnetic segment, or the third magnetic segment includes a magnetic material.

Example 22 may include the computing device of example 21, wherein the package substrate includes a dielectric layer above or below the core layer, the third magnetic segment and the interconnect are within the dielectric layer, and the dielectric layer includes a resin material selected from FR-4-epoxy, polyfunctional FR-4, high temperature one component epoxy system, bismaleimide trizaine epoxy (BT), polyimide epoxy, cyanate ester (CE), polyimide, or polyimide and polytetrafluoroethylene (PTFE).

Example 23 may include the computing device of examples 21-22, wherein the package substrate includes an insulated polymer layer between the dielectric layer and the core layer, and the first coaxial line and the second coaxial line are vertically through the core layer, the polymer layer, and the dielectric layer.

Example 24 may include the computing device of examples 21-22, wherein the first coaxial line or the second coaxial line includes a cavity surrounded by a conductive layer, wherein the cavity is filled by a dielectric material including epoxy polymeric material with silica particles or filler particles, and the conductive layer includes a material selected from the group consisting of titanium (Ti), molybdenum (Mo), gold (Au), platinum (Pt), aluminum (Al), nickel (Ni), copper (Cu), chromium (Cr), hafnium (Hf), indium (In), and an alloy of Ti, Mo, Au, Pt, Al, Ni, Cu, Cr, TiAlN, HfAlN, or InAlO.

Example 25 may include the computing device of examples 21-22, wherein the computing device includes a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A semiconductor device, comprising:
   a core layer of a package substrate;
   an inductor including a first coaxial line and a second coaxial line vertically through the core layer, and an interconnect within the package substrate coupling the first coaxial line and the second coaxial line, wherein the interconnect is above or below the core layer, and wherein each of the first coaxial lines and the second coaxial line comprises a conductive layer laterally surrounding a non-conductive plug material;
   a first magnetic segment surrounding the first coaxial line within the core layer;
   a second magnetic segment surrounding the second coaxial line within the core layer; and
   a third magnetic segment surrounding the interconnect and coupled to the first magnetic segment and the second magnetic segment, wherein the first magnetic segment, the second magnetic segment, or the third magnetic segment includes a magnetic material.

2. The semiconductor device of claim 1, wherein the package substrate includes a dielectric layer above or below the core layer, and the third magnetic segment and the interconnect are within the dielectric layer.

3. The apparatus of claim 2, wherein the dielectric layer includes a resin material selected from FR-4-epoxy, polyfunctional FR-4, high temperature one component epoxy system, bismaleimide trizaine epoxy (BT), polyimide epoxy, cyanate ester (CE), polyimide, or polyimide and polytetrafluoroethylene (PTFE).

4. The semiconductor device of claim 2, wherein the package substrate includes an insulated polymer layer between the dielectric layer and the core layer, and the first coaxial line and the second coaxial line are vertically through the core layer, the polymer layer, and the dielectric layer.

5. The semiconductor device of claim 1, wherein the first magnetic segment and the second magnetic segment are coupled together within the core layer by the magnetic material.

6. The semiconductor device of claim 1, further comprising:
   a conductive stop partially embedded in the third magnetic segment, and separated from the interconnect.

7. The semiconductor device of claim 1, wherein the magnetic material included in the first magnetic segment, the second magnetic segment, or the third magnetic segment includes a diamagnetism material, a paramagnetism material, a ferromagnetism material, a ferrimagnetism material, or an antiferromagnetism material.

8. The semiconductor device of claim 1, wherein the conductive layer includes a material selected from the group consisting of titanium (Ti), molybdenum (Mo), gold (Au), platinum (Pt), aluminum (Al), nickel (Ni), copper (Cu), chromium (Cr), hafnium (Hf), indium (In), and an alloy of Ti, Mo, Au, Pt, Al, Ni, Cu, Cr, TiAlN, HfAlN, or InAlO.

9. The semiconductor device of claim 1, wherein the non-conductive plug material includes a polymer material, or an epoxy polymeric material with silica particles or filler particles.

10. The semiconductor device of claim 1, wherein the interconnect includes a material selected from the group consisting of titanium (Ti), molybdenum (Mo), gold (Au), platinum (Pt), aluminum (Al), nickel (Ni), copper (Cu), chromium (Cr), hafnium (Hf), indium (In), and an alloy of Ti, Mo, Au, Pt, Al, Ni, Cu, Cr, TiAlN, HfAlN, or InAlO.

11. The apparatus of claim 1, wherein the core layer includes organic resin, inorganic filler, or a conductive material.

12. The semiconductor device of claim 1, wherein the package substrate includes the core layer and multiple other layers, and the first coaxial line and the second coaxial line are vertically through the multiple other layers.

13. The semiconductor device of claim 12, wherein the package substrate includes a material selected from a glass material, a resin material, or a filler material.

14. A computing device, comprising:
a semiconductor die;
a printed circuit board (PCB); and
a package substrate between the semiconductor die and the PCB, wherein the package substrate includes:
  a core layer;
  an inductor including a first coaxial line and a second coaxial line vertically through the core layer, and an interconnect within the package substrate coupling the first coaxial line and the second coaxial line, wherein the interconnect is above or below the core layer, and wherein each of the first coaxial lines and the second coaxial line comprises a conductive layer laterally surrounding a non-conductive plug material;
  a first magnetic segment surrounding the first coaxial line within the core layer;
  a second magnetic segment surrounding the second coaxial line within the core layer; and
  a third magnetic segment surrounding the interconnect and coupled to the first magnetic segment and the second magnetic segment, wherein the first magnetic segment, the second magnetic segment, or the third magnetic segment includes a magnetic material.

15. The computing device of claim 14, wherein the package substrate includes a dielectric layer above or below the core layer, the third magnetic segment and the interconnect are within the dielectric layer, and the dielectric layer includes a resin material selected from FR-4-epoxy, polyfunctional FR-4, high temperature one component epoxy system, bismaleimide trizaine epoxy (BT), polyimide epoxy, cyanate ester (CE), polyimide, or polyimide and polytetrafluoroethylene (PTFE).

16. The computing device of claim 14, wherein the package substrate includes an insulated polymer layer between the dielectric layer and the core layer, and the first coaxial line and the second coaxial line are vertically through the core layer, the polymer layer, and the dielectric layer.

17. The computing device of claim 14, wherein the non-conductive plug material comprises epoxy polymeric material with silica particles or filler particles, and the conductive layer includes a material selected from the group consisting of titanium (Ti), molybdenum (Mo), gold (Au), platinum (Pt), aluminum (Al), nickel (Ni), copper (Cu), chromium (Cr), hafnium (Hf), indium (In), and an alloy of Ti, Mo, Au, Pt, Al, Ni, Cu, Cr, TiAlN, HfAlN, or InAlO.

18. The computing device of claim 14, wherein the computing device includes a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

* * * * *